(12) United States Patent
Inoue et al.

(10) Patent No.: US 11,368,141 B2
(45) Date of Patent: Jun. 21, 2022

(54) RESONATOR AND RESONANT DEVICE

(71) Applicant: Murata Manufacturing Co., Ltd., Nagaokakyo (JP)

(72) Inventors: Yoshihisa Inoue, Nagaokakyo (JP); Ryota Kawai, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 277 days.

(21) Appl. No.: 16/731,245

(22) Filed: Dec. 31, 2019

(65) Prior Publication Data
US 2020/0136587 A1 Apr. 30, 2020

Related U.S. Application Data

(63) Continuation of application No. PCT/JP2018/011992, filed on Mar. 26, 2018.

(30) Foreign Application Priority Data

Aug. 16, 2017 (JP) .............................. JP2017-157097

(51) Int. Cl.
*H03H 9/24* (2006.01)
*H03H 9/02* (2006.01)
(Continued)

(52) U.S. Cl.
CPC ...... *H03H 9/2457* (2013.01); *H03H 9/02259* (2013.01); *H03H 9/02393* (2013.01); *H03H 9/0595* (2013.01); *H03H 9/1057* (2013.01)

(58) Field of Classification Search
CPC ............. H03H 9/2457; H03H 9/02259; H03H 9/02393; H03H 9/0595; H03H 9/1057;
(Continued)

(56) References Cited

U.S. PATENT DOCUMENTS

| 9,584,093 B2 | 2/2017 | Nishimura et al. |
| 10,374,569 B2 | 8/2019 | Umeda et al. |

(Continued)

FOREIGN PATENT DOCUMENTS

| JP | 2012060264 A | 3/2012 |
| JP | 2013192013 A | 9/2013 |

(Continued)

OTHER PUBLICATIONS

International Search Report issued in PCT/JP2018/011992, dated Jun. 5, 2018.
(Continued)

*Primary Examiner* — Jeffrey M Shin
(74) *Attorney, Agent, or Firm* — ArentFox Schiff LLP

(57) ABSTRACT

A resonator is provided that includes a base, and three or more vibrating arms each including a first and second electrodes and a piezoelectric film disposed therebetween and having a top surface facing the first electrode. The piezoelectric film vibrates in a predetermined vibration mode when a voltage is applied between the first and second electrodes. Moreover, the three or more vibrating arms include two first arms each located on an outermost side in a direction in which the three or more vibrating arms are arranged and that vibrate in a same phase, and one or more second arms disposed between the two first arms. Each first arm is greater in mass than each second arm.

15 Claims, 7 Drawing Sheets

(51) Int. Cl.
*H03H 9/05* (2006.01)
*H03H 9/10* (2006.01)

(58) Field of Classification Search
CPC ........... H03H 9/02157; H03H 9/02338; H03H 9/02448; H03H 9/2489; H03H 9/1035
See application file for complete search history.

(56) References Cited

U.S. PATENT DOCUMENTS

| | | | |
|---|---|---|---|
| 2016/0072473 A1* | 3/2016 | Nishimura | H03H 9/21 310/370 |
| 2018/0034441 A1 | 2/2018 | Hirota et al. | |
| 2018/0226937 A1 | 8/2018 | Umeda et al. | |

FOREIGN PATENT DOCUMENTS

| | | |
|---|---|---|
| JP | 2016178588 A | 10/2016 |
| WO | 2014185282 A1 | 11/2014 |
| WO | 2016175218 A1 | 11/2016 |
| WO | 2017090380 A1 | 6/2017 |

OTHER PUBLICATIONS

Written Opinion of the International Searching Authority issued in PCT/JP2018/011992, dated Jun. 5, 2018.

* cited by examiner

RESONATOR AND RESONANT DEVICE

CROSS REFERENCE TO RELATED APPLICATIONS

The present application is a continuation of PCT/JP2018/011992 filed Mar. 26, 2018, which claims priority to Japanese Patent Application No. 2017-157097, filed Aug. 16, 2017, the entire contents of each of which are incorporated herein by reference.

TECHNICAL FIELD

The present invention relates to a resonator and a resonant device.

BACKGROUND

Currently, resonant devices using MEMS (micro electro mechanical systems) technology are used as, for example, a timing device. Such resonant devices are implemented on a printed circuit board to be incorporated into an electronic device, such as a smartphone. These resonant devices include a lower substrate, an upper substrate that forms a cavity with the lower substrate, and a resonator disposed in the cavity between the lower substrate and the upper substrate.

For example, Patent Document 1 (identified below) describes a resonator including a plurality of vibrating arms. In the resonator, each vibrating arm is connected to a front end of a base portion at its fixed end, and the base portion is connected to a support portion at a rear end opposite from the front end. In the resonator described in Patent Document 1, the length (i.e., in a direction from the front end toward the rear end) of the base portion is set to less than the width of the base portion. For this reason, the resonator has such a structure that the base portion easily undergoes bending displacement. With this configuration, DLD ("drive level dependency") is improved.

Patent Document 1: International Publication No. 2016/175218.

However, with the technique described in Patent Document 1, while improvement in DLD is achieved, for example, holding can be instable, so there is room for further consideration to further appropriately improve DLD.

SUMMARY OF THE INVENTION

Therefore, it is an object of the exemplary embodiments of the present invention to improve DLD in a resonator.

In an exemplary aspect of the present invention, a resonator is provided that includes a base, and three or more vibrating arms each including a first electrode, a second electrode, and a piezoelectric film provided between the first electrode and the second electrode and having a top surface facing the first electrode. Moreover, the piezoelectric film is configured to vibrate in a predetermined vibration mode when a voltage is applied between the first and second electrodes, one end of each vibrating arm is a fixed end that connects with a front end of the base, another end of each vibrating arm is a free end extending in a direction away from the front end. The three or more vibrating arms include two first arms each located on an outermost side in a direction in which the three or more vibrating arms are arranged and configured to vibrate in a same phase, and one or more second arms placed between the two first arms.

According to the exemplary embodiment, each first arm is greater in mass than each second arm.

The exemplary embodiments of the present invention improve DLD of a resonator.

DETAILED DESCRIPTION OF EMBODIMENTS

First Exemplary Embodiment

Figure 1:
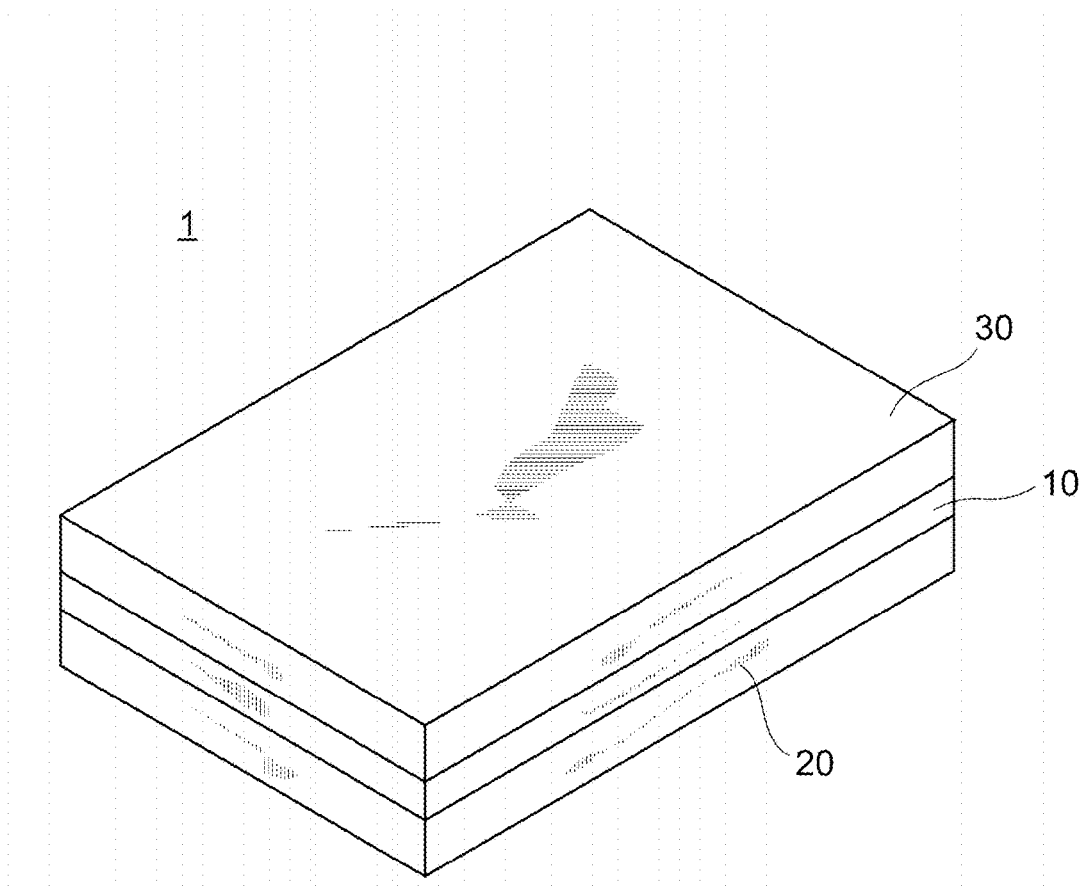
FIG. 1 is a perspective view that schematically shows a resonant device according to a first exemplary embodiment of the present invention.
Figure 2:
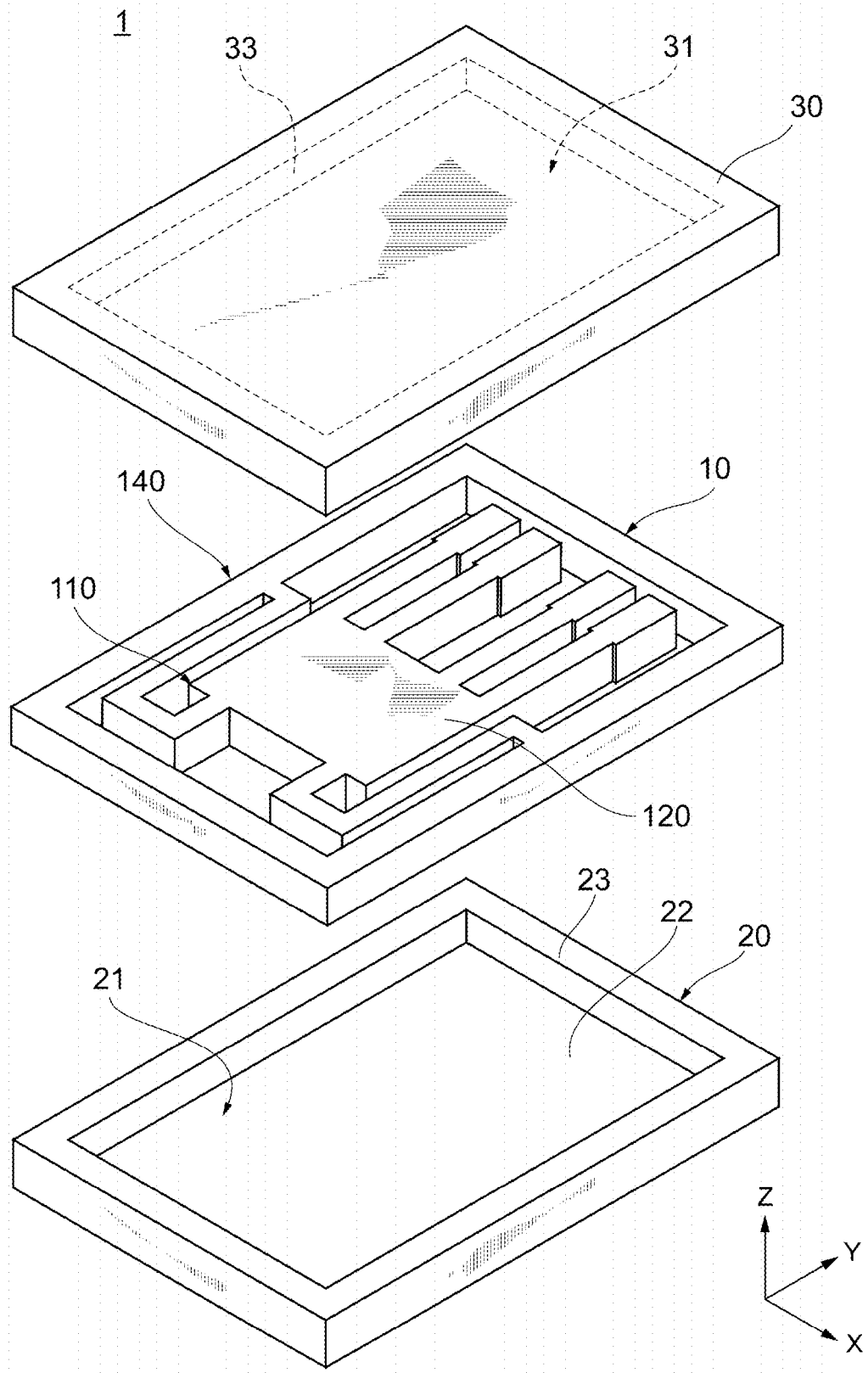
FIG. 2 is an exploded perspective view that schematically shows the structure of the resonant device according to the first exemplary embodiment of the present invention.

Hereinafter, a first exemplary embodiment of the present invention will be described with reference to the attached drawings. FIG. 1 is a perspective view that schematically shows a resonant device 1 according to the first embodiment of the present invention. FIG. 2 is an exploded perspective view that schematically shows the structure of the resonant device 1 according to the first embodiment of the present invention.

As shown, the resonant device 1 includes a resonator 10, and lid elements (i.e., a top lid 30 and a bottom lid 20) provided to face each other with the resonator 10 interposed therebetween. In other words, the resonant device 1 is made up of the bottom lid 20, the resonator 10, and the top lid 30, stacked in this order.

The resonator 10 is bonded to the bottom lid 20 and the top lid 30. Thus, the resonator 10 is encapsulated, and a vibrating space for the resonator 10 is formed. In an exemplary aspect, the resonator 10, the bottom lid 20, and the top lid 30 each are made from an Si substrate. The resonator 10, the bottom lid 20, and the top lid 30 are bonded to each other by bonding the Si substrates to each other. In one aspect, the resonator 10 and the bottom lid 20 may be made from an SOI substrate.

Moreover, the resonator 10 is a MEMS resonator manufactured by using the MEMS technology. In the present embodiment, description will be made on the assumption that the resonator 10 is made from, for example, a silicon substrate. Hereinafter, the components of the resonant device 1 will be described in detail.

(1. Top Lid 30)

The top lid 30 expands in a planar shape along an XY-plane and has, for example, a flat rectangular parallelepiped recess 31 at its back surface. The recess 31 is surrounded by a side wall 33 and forms part of a vibrating space that is a space in which the resonator 10 vibrates.

(2. Bottom Lid 20)

The bottom lid 20 has a rectangular planar bottom plate 22 provided along the XY-plane and a side wall 23 extending in a Z-axis direction (that is, a direction in which the bottom lid 20 and the resonator 10 are stacked) from a peripheral portion of the bottom plate 22. The bottom lid 20 has a recess 21 at a surface facing the resonator 10 that is formed by a surface of the bottom plate 22 and an inner surface of the side wall 23. The recess 21 is part of the vibrating space for the resonator 10 with the vibrating space being hermetically sealed by the above-described top lid 30 and bottom lid 20 and maintained in a vacuum state. In exemplary aspects, the vibrating space can be filled with gas, such as inert gas.

(3. Resonator 10)

Figure 3:
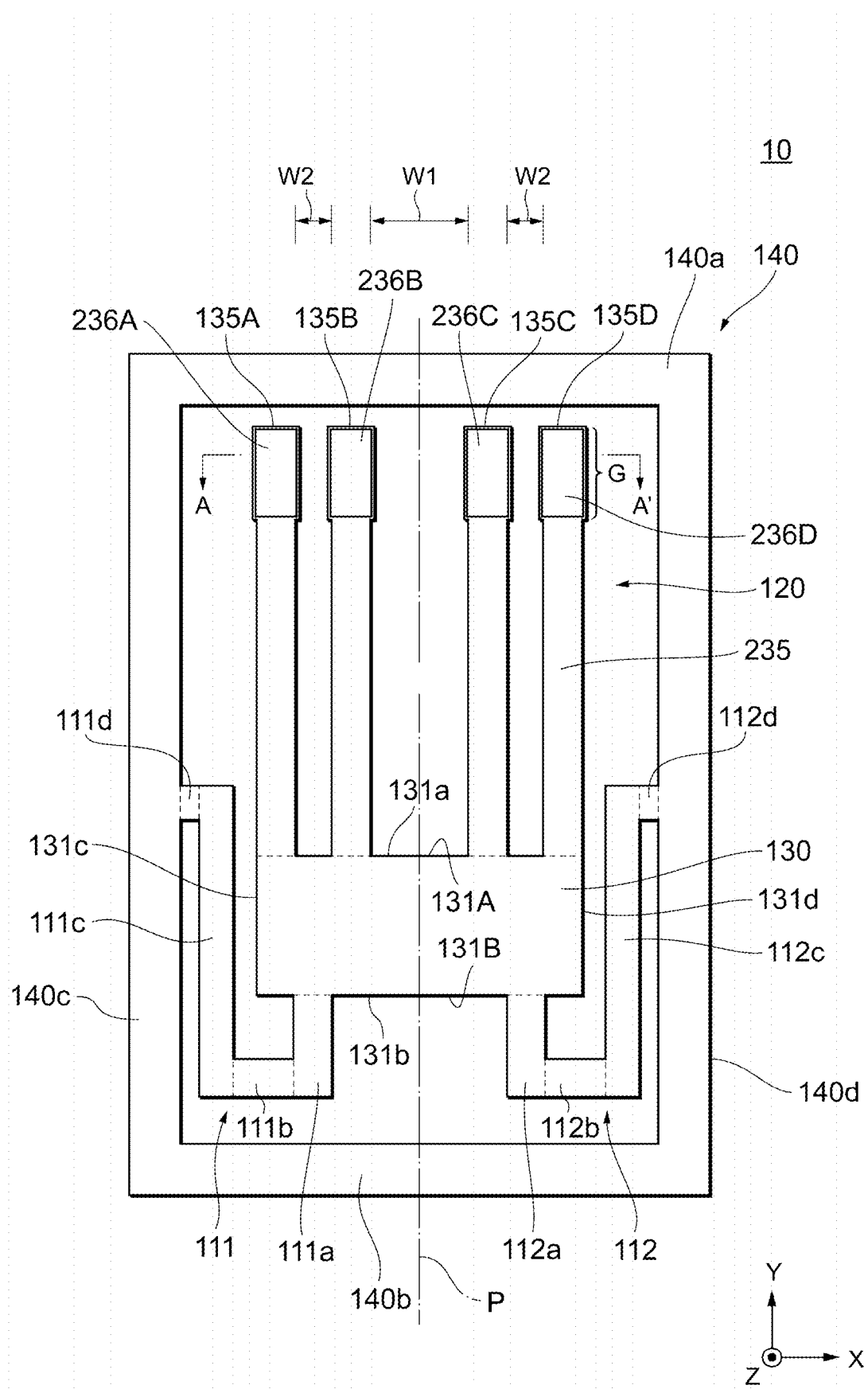
FIG. 3 is a plan view of a resonator according to the first exemplary embodiment of the present invention in a state where an upper substrate is removed.

FIG. 3 is a plan view that schematically shows the structure of the resonator 10 according to the present embodiment. The components of the resonator 10 according to the present embodiment will be described with reference to FIG. 3. The resonator 10 includes a vibrating portion 120, a holding portion 140, and holding arms 111, 112.

(a) Vibrating Portion 120

The vibrating portion 120 has a rectangular outline or shape and expands along the XY-plane in the Cartesian coordinate system of FIG. 3. The vibrating portion 120 is provided on the inner side of the holding portion 140 (i.e., a frame). A space is formed with a predetermined clearance between the vibrating portion 120 and the holding portion 140. In the example of FIG. 3, the vibrating portion 120 includes a base portion 130 (or simply a "base") and four vibrating arms 135A to 135D (also collectively referred to as vibrating arms 135). It is noted that the number of the vibrating arms is not limited to four and is set to a selected number greater than or equal to, for example, three. In the present embodiment, each vibrating arm 135 and the base portion 130 are integrally formed.

As further shown, the base portion 130 has long sides 131a, 131b in an X-axis direction and short sides 131c, 131d in a Y-axis direction in plan view. The long side 131a is one of the sides of a surface 131A (hereinafter, also referred to as front end 131A) at a front end of the base portion 130. The long side 131b is one of the sides of a surface 131B (hereinafter, also referred to as rear end 131B) at a rear end of the base portion 130. In the base portion 130, the front end 131A and the rear end 131B are provided to face each other.

The base portion 130 is connected to the vibrating arms 135 (described later) at the front end 131A and connected to the holding arms 111, 112 (described later) at the rear end 131B. In the exemplary aspect, the base portion 130 has a substantially rectangular shape in plan view in the example of FIG. 3. However, it is noted that the base portion 130 is not limited thereto. The base portion 130 should be formed substantially symmetrically with respect to an imaginary plane P that is defined along the perpendicular bisector of the long side 131a. The base portion 130 may have, for example, a trapezoidal shape in which the long side 131b is shorter than the long side 131a or a half-round shape having the long side 131a as a diameter. Each of the long sides 131a, 131b and the short sides 131c, 131d is not limited to a linear shape and may be a curved shape.

In the base portion 130, a base portion length (in FIG. 3, the length of each of the short sides 131c, 131d in the Y-axis direction) that is the longest distance between the front end 131A and the rear end 131B in a direction from the front end 131A toward the rear end 131B is approximately 37 μm, for example. A base portion width (in FIG. 3, the length of each of the long sides 131a, 131b in the X-axis direction) that is the longest distance between the side ends of the base portion 130 in a width direction perpendicular to the direction of the base portion length is approximately 285 μm, for example.

The vibrating arms 135 extend in the Y-axis direction and each have the same size. The vibrating arms 135 each are provided parallel to the Y-axis direction between the base portion 130 and the holding portion 140. One end of each vibrating arm 135 is connected to the front end 131A of the base portion 130 to serve as a fixed end, and the other end of each vibrating arm 135 serves as a free end. The vibrating arms 135 are arranged in the X-axis direction at predetermined intervals. In an exemplary aspect, the vibrating arms 135 each have, for example, approximately 50 μm in width in the X-axis direction and approximately 420 μm in length in the Y-axis direction.

In each of the vibrating arms 135, for example, a portion from the free end up to approximately 150 μm is wider in width in the X-axis direction than the other portion of the vibrating arm 135. The portion wider in width is referred to as weight portion G. The weight portion G is, for example, wider by 10 μm in width on each side along the X-axis direction than the other portion of the vibrating arm 135, and is approximately 70 μm in width in the X-axis direction. The weight portion G is integrally formed in the same process with the vibrating arm 135. With the weight portion G, the weight of the vibrating arm 135 per unit length is greater on the free end side than that on the fixed end side. Therefore, since the vibrating arms 135 each have the weight portion G at the free end side, the amplitude of vibrations in an up-down direction in each vibrating arm can be increased.

In the vibrating portion 120 of the present embodiment, in the X-axis direction, the two vibrating arms 135A, 135D are disposed on the outer side, and the two vibrating arms 135B, 135C are disposed on the inner side. A clearance W1 between the vibrating arms 135B, 135C in the X-axis direction is set to greater than a clearance W2 between the outer vibrating arm 135A (135D) (which is an example of a first arm) and the inner vibrating arm 135B (135C) (which is an example of a second arm) adjacent to the outer vibrating arm 135A (135D) in the direction in which the vibrating arms 135 are arranged (i.e., in the X-axis direction). The clearance W1 is, for example, approximately 35 μm. The clearance W2 is, for example, approximately 25 μm. Vibration characteristics are improved when the clearance W2 is less than the clearance W1. The clearance W1 may be set to less than the clearance W2 or may be equal to the clearance W2 so that the resonant device 1 can be miniaturized.

In addition, a protective film 235 is formed on the surface (e.g., surface facing the top lid 30) of the vibrating portion 120 so as to cover the entire surface. In addition, adjusting films 236A to 236D (hereinafter, the adjusting films 236A to 236D are also collectively referred to as adjusting films 236) are respectively formed on the surface of the protective film 235 at the free end-side distal ends of the vibrating arms 135A to 135D. The resonant frequency of the vibrating portion 120 can be adjusted with the protective film 235 and the adjusting films 236. The protective film 235 just needs to be formed at least on the vibrating arms 135 and does not need to be formed on the base portion 130.

According to the exemplary aspect, the adjusting films 236 each are formed on the protective film 235 in a region whose displacement caused by vibrations is relatively large in the vibrating portion 120 such that the surface is exposed. Specifically, each adjusting film 236 is formed on and/or near the free end of an associated one of the vibrating arms 135. For example, in the present embodiment, each adjusting film 236 is formed on the weight portion G of an associated one of the vibrating arms 135.

Among the vibrating arms 135 according to the present embodiment, each of the outer vibrating arms 135A, 135D is greater in mass than each of the inner vibrating arms 135B, 135C. More specifically, each of the outer vibrating arms 135A, 135D is greater in mass than each of the inner vibrating arms 135B, 135C at a distal end portion (which is a region whose displacement caused by vibrations is relatively large and which corresponds to, for example, the weight portion G). Examples of a specific mode include a configuration that each of the outer vibrating arms 135A, 135D is greater in thickness in the Z-axis direction (laminated direction) at least in the free end-side region than each of the inner vibrating arms 135B, 135C and a configuration that each of the outer vibrating arms 135A, 135D is greater in width along the X-axis direction than each of the inner vibrating arms 135B, 135C. In addition, each of the outer vibrating arms 135A, 135D may be made of a material having a greater mass at least in the free end-side region than each of the inner vibrating arms 135B, 135C.

Hereinafter, a configuration that each of the adjusting films 236A, 236D respectively formed in the outer vibrating arms 135A, 135D is greater in thickness in the Z-axis direction (e.g., laminated direction) than each of the adjusting films 236B, 236C respectively formed in the inner vibrating arms 135B, 135C will be described as an example. It is noted that the thickness of each adjusting film 236 does not need to be uniform. Each adjusting film 236 may have an uneven surface. For comparison of the thickness of the adjusting film, for example, the thickness of a portion formed at the free end of the vibrating arm 135, the thickness of a thickest portion, the thickness of a thinnest portion, an average thickness, or the like, may be used.

(b) Holding Portion 140

The holding portion 140 (i.e., a frame) is formed in a rectangular frame shape along the XY-plane. The holding portion 140 is provided so as to surround the vibrating portion 120 along the XY-plane in plan view. It is noted that the holding portion 140 just needs to be provided at least partially around the vibrating portion 120 and is not limited to a frame shape. For example, the holding portion 140 just needs to be provided around the vibrating portion 120 to such an extent that the holding portion 140 holds the vibrating portion 120 and can be bonded to the top lid 30 and the bottom lid 20.

In the present embodiment, the holding portion 140 is made up of integrally formed square columnar frame elements 140*a* to 140*d*. As shown in FIG. 3, the frame element 140*a* faces the free ends of the vibrating arms 135, and the longitudinal direction of the frame element 140*a* is provided parallel to the X-axis. The frame element 140*b* faces the rear end 131B of the base portion 130, and the longitudinal direction of the frame element 140*b* is provided parallel to the X-axis. The frame element 140*c* faces the side end (short side 131*c*) of the base portion 130 and the vibrating arm 135A, the longitudinal direction of the frame element 140*c* is provided parallel to the Y-axis, and both ends of the frame element 140*c* are respectively connected to one ends of the frame elements 140*a*, 140*b*. The frame element 140*d* faces the side end (short side 131*d*) of the base portion 130 and the vibrating arm 135D, the longitudinal direction of the frame element 140*d* is provided parallel to the Y-axis, and both ends of the frame element 140*d* are respectively connected to the other ends of the frame elements 140*a*, 140*b*.

In the present embodiment, description will be made on the assumption that the holding portion 140 is covered with the protective film 235. However, it is noted that the configuration is not limited thereto. The protective film 235 need not be formed on the surface of the holding portion 140.

(c) Holding Arms 111, 112

As further shown, the holding arm 111 and the holding arm 112 are provided on the inner side of the holding portion 140, and connect the rear end 131B of the base portion 130 to the frame elements 140*c*, 140*d*. As shown in FIG. 3, the holding arm 111 and the holding arm 112 are formed substantially symmetrically with respect to the imaginary plane P defined parallel to the YZ-plane along a center line of the base portion 130 in the X-axis direction.

Moreover, in the exemplary aspect, the holding arm 111 has arms 111*a*, 111*b*, 111*c*, 111*d*. One end of the holding arm 111 is connected to the rear end 131B of the base portion 130, and the holding arm 111 extends from there toward the frame element 140*b*. The holding arm 111 bends in a direction toward the frame element 140*c* (that is, the X-axis direction), further bends in a direction toward the frame element 140*a* (that is, the Y-axis direction), bends in a direction toward the frame element 140*c* (that is, the X-axis direction) again, and then the other end is connected to the frame element 140*c*.

The arm 111*a* is provided between the base portion 130 and the frame element 140*b* such that the arm 111*a* faces the frame element 140*c* and the longitudinal direction of the arm 111*a* is parallel to the Y-axis. One end of the arm 111*a* is connected to the base portion 130 at the rear end 131B, and the arm 111*a* extends from there substantially perpendicularly to the rear end 131B, that is, the arm 111*a* extends in the Y-axis direction. It is desirable that an axis passing through the center of the arm 111*a* in the X-axis direction be provided on the inner side with respect to the center line of the vibrating arm 135A. In the example of FIG. 3, the arm 111*a* is provided between the vibrating arm 135A and the vibrating arm 135B. The other end of the arm 111*a* is connected to one end of the arm 111*b* at its side surface. In an exemplary aspect, the arm 111*a* is approximately 20 μm in width defined in the X-axis direction and approximately 25 μm in length defined in the Y-axis direction.

The arm 111*b* is provided between the base portion 130 and the frame element 140*b* such that the arm 111*b* faces the frame element 140*b* and the longitudinal direction of the arm 111*b* is parallel to the X-axis direction. One end of the arm 111*b* is connected to the other end of the arm 111*a*, that is, the side surface facing the frame element 140*c*, and the arm 111*b* extends from there substantially perpendicularly to the arm 111*a*, that is, the arm 111*b* extends in the X-axis direction. The other end of the arm 111*b* is connected to one end of the arm 111*c*, that is, a side surface facing the vibrating portion 120. The arm 111*b* is, for example, approximately 20 μm in width defined in the Y-axis direction and approximately 92 μm in length defined in the X-axis direction.

As further shown, the arm 111*c* is provided between the base portion 130 and the frame element 140*c* such that the arm 111*c* faces the frame element 140*c* and the longitudinal direction of the arm 111*c* is parallel to the Y-axis direction. One end of the arm 111*c* is connected to the other end of the arm 111*b* at its side surface, and the other end of the arm 111*c* is connected to one end of the arm 111*d*, that is, a side surface on a frame element 140*c* side. The arm 111*c* is, for example, approximately 20 μm in width defined in the X-axis direction and approximately 255 μm in length defined in the Y-axis direction.

The arm 111*d* is provided between the base portion 130 and the frame element 140*c* such that the arm 111*d* faces the frame element 140a and the longitudinal direction of the arm 111d is parallel to the X-axis direction. One end of the arm 111d is connected to the other end of the arm 111c, that is, the side surface facing the frame element 140c. The other end of the arm 111d is connected to the frame element 140c at a position facing near a connection portion of the vibrating arm 135A with the base portion 130, and the arm 111d extends from there substantially perpendicularly to the frame element 140c, that is, the arm 111d extends in the X-axis direction. The arm 111d is, for example, approximately 50 μm in width defined in the Y-axis direction and approximately 5 μm in length defined in the X-axis direction.

In this way, the holding arm 111 is connected to the base portion 130 at the arm 111a, bends at the connection portion between the arm 111a and the arm 111b, the connection portion between the arms 111b, 111c, and the connection portion between the arms 111c, 111d, and is then connected to the holding portion 140.

The holding arm 112 has arms 112a, 112b, 112c, 112d. In general, holding arm 112 has the same configuration as holding arm 111 and is symmetrically disposed about the P imaginary plane. One end of the holding arm 112 is connected to the rear end 131B of the base portion 130, and the holding arm 112 extends from there toward the frame element 140b. The holding arm 112 bends in a direction toward the frame element 140d (that is, the X-axis direction), further bends in a direction toward the frame element 140a (that is, the Y-axis direction), bends in a direction toward the frame element 140d (that is, the X-axis direction) again, and then the other end is connected to the frame element 140d.

The configurations of the arms 112a, 112b, 112c, 112d are respectively symmetrical to the configurations of the arms 111a, 111b, 111c, 111d, so the detailed description is omitted.

(4. Multilayer Structure)

Figure 4:
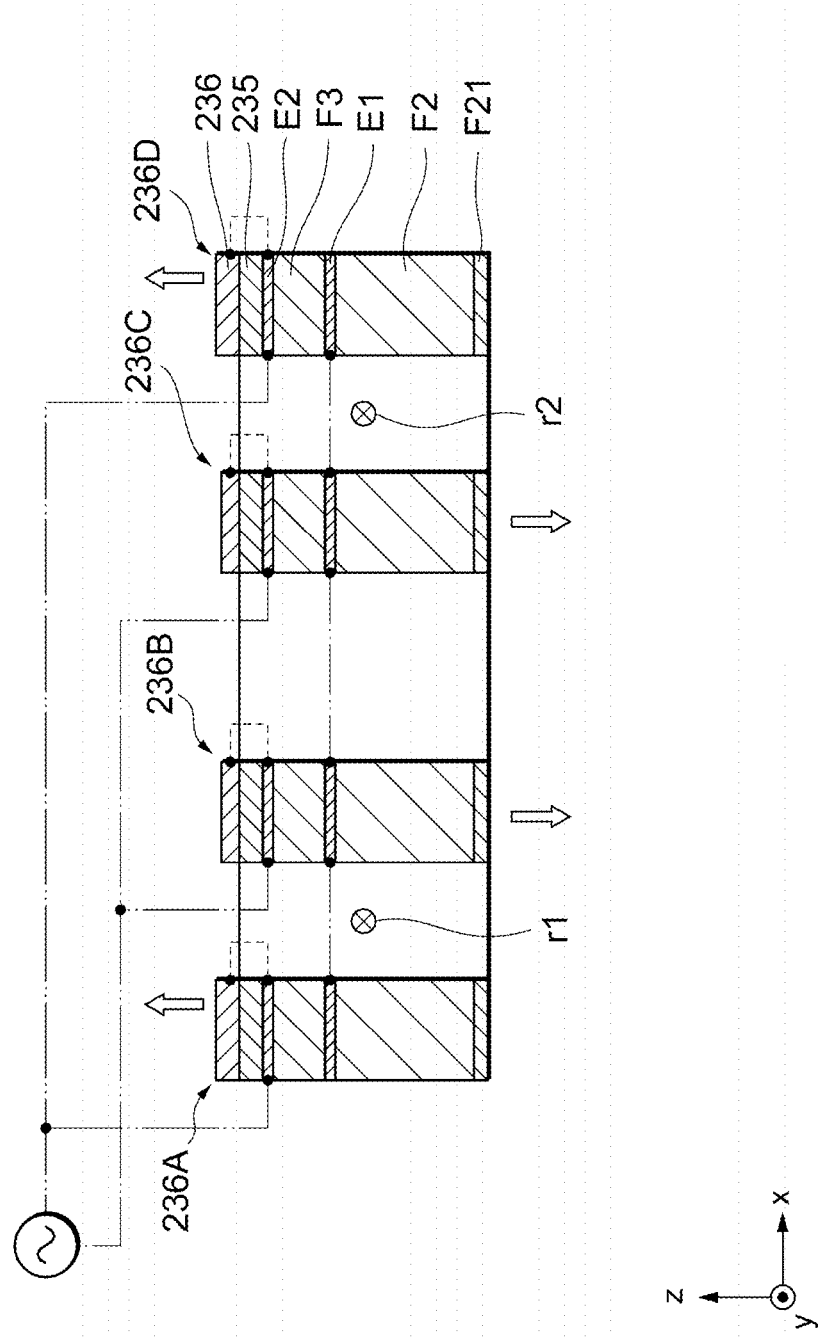
FIG. 4 is a cross-sectional view taken along the line A-A' in FIG. 3.

A multilayer structure of the resonator 10 will be described with reference to FIG. 4 by taking the vibrating arms 135D and the base portion 130 as examples. FIG. 4 is a schematic diagram that schematically shows the cross-sectional view taken along the line A-A' in FIG. 3.

In the resonator 10, the holding portion 140, the base portion 130, the vibrating arms 135, and the holding arms 111, 112 are integrally formed in the same process. In the resonator 10, first, a metal layer E1 (which is an example of a second electrode) is laminated on an Si (silicon) substrate F2. The piezoelectric thin film F3 (which is an example of a piezoelectric film) is laminated on the metal layer E1 so as to cover the metal layer E1. Moreover, the metal layer E2 (which is an example of a first electrode) is further laminated on the surface of the piezoelectric thin film F3. The protective film 235 is laminated on the metal layer E2 so as to cover the metal layer E2. The adjusting film 236 is further laminated near the free end (e.g., weight portion G) of each vibrating arm 135 to face the top surface of the piezoelectric thin film F3 with the protective film 235 interposed therebetween.

The Si substrate F2 is made from, for example, a degenerate n-type Si semiconductor having a thickness of approximately 5 μm, and may contain P (phosphorus), As (arsenic), Sb (antimony), or the like, as an n-type dopant. Particularly, a rotation angle that the vibrating arm 135 makes with [100] crystal axis of the Si substrate F2 made from an n-type Si semiconductor or a crystal axis equivalent to this desirably falls within the range greater than 0 degrees and less than or equal to 15 degrees (or the range may be greater than or equal to 0 degrees and less than or equal to 15 degrees) or the range greater than or equal to 75 degrees and less than or equal to 90 degrees. A rotation angle means an angle that a direction in which the holding arm 110 extends makes with [100] crystal axis of the Si substrate F2 or a line segment along a crystal axis equivalent to this. The resistance value of degenerate Si that is used for the Si substrate F2 is, for example, lower than 16 mΩ·cm and more preferably lower than or equal to 1.2 mΩ·cm. A silicon oxide (for example, $SiO_2$) layer F21 (temperature characteristics correction layer) having approximately 380 nm is formed on the bottom surface of the Si substrate F2. Thus, temperature characteristics can be improved. When degenerate silicon is used for the Si substrate, the Si substrate F2 can replace the metal layer E1, so a further thin layer can be achieved.

In the present embodiment, a temperature characteristics correction layer is a layer having a function of reducing the temperature coefficient (that is, the rate of change per temperature) of frequency at least near room temperature in the vibrating portion when the temperature correction layer is formed on the Si substrate F2 as compared to when the temperature characteristics correction layer is not formed on the Si substrate F2. When the vibrating portion 120 has a temperature characteristics correction layer, for example, a change, with temperature, in the resonant frequency of a multilayer structure made up of the Si substrate F2, the metal layers E1, E2, the piezoelectric thin film F3, and the silicon oxide layer (temperature correction layer) F21 is reduced.

In the resonator 10, the silicon oxide layer F21 is desirably formed with a uniform thickness. A uniform thickness means that variations in the thickness of the silicon oxide layer F21 fall within ±20% from an average value of the thickness.

Moreover, the silicon oxide layer F21 may be formed on the top surface of the Si substrate F2 or may be formed on both the top surface and bottom surface of the Si substrate F2. In the holding portion 140, the silicon oxide layer F21 need not be formed on the bottom surface of the Si substrate F2.

The metal layers E2, E1 are formed by using Mo (molybdenum), aluminum (Al), or another material, having a thickness of, for example, greater than or equal to approximately 0.1 μm to less than or equal to approximately 0.2 According to an exemplary aspect, the metal layers E2, E1 are formed in a desired shape by etching, or another method. The metal layer E1 is formed to function as a lower electrode in, for example, the vibrating portion 120. In the holding arms 111, 112 or the holding portion 140, the metal layer E1 is formed to function as a wire for connecting the lower electrode to an alternating-current power supply provided outside the resonator 10.

On the other hand, the metal layer E2 is formed to function as an upper electrode in the vibrating portion 120. In the holding arms 111, 112 or the holding portion 140, the metal layer E2 is formed to function as a wire for connecting the upper electrode to a circuit provided outside the resonator 10.

In connecting the alternating-current power supply to the lower wire or the upper wire, an electrode may be formed on the outer surface of the top lid 30 to connect the circuit to the lower wire or the upper wire or a via may be formed in the top lid 30 and a wire may be formed by filling an electrically conductive material inside the via to connect the alternating-current power supply to the lower wire or the upper wire.

Moreover, in an exemplary aspect, the piezoelectric thin film F3 is a thin film of a piezoelectric body that converts an applied voltage to vibrations and may contain, for example, a nitride, such as AlN (aluminum nitride), or an oxide as a main ingredient. Specifically, the piezoelectric thin film F3 may be made of ScAlN (scandium aluminum nitride). ScAlN is a substance in which part of aluminum in aluminum nitride is replaced with scandium. The piezoelectric thin film F3 is, for example, approximately 0.81 μm.

The piezoelectric thin film F3 extends or contracts in an in-plane direction of the XY-plane, that is, Y-axis direction, according to an electric field that is applied to the piezoelectric thin film F3 by the metal layers E2, E1. With this extension or contraction of the piezoelectric thin film F3, the vibrating arms 135 displace their free ends toward the inner surfaces of the bottom lid 20 and top lid 30 and vibrate in an out-of-plane bending vibration mode.

The protective film 235 is made of a material of which the rate of reduction in mass resulting from etching is lower than that of the adjusting film 236. Specifically, the protective film 235 may be made from a nitride film of AlN (aluminum nitride), SiN, or the like, or an oxide film of $Ta_2O_5$ (tantalum pentoxide), $SiO_2$ (silicon dioxide), $Al_2O_3$ (aluminum oxide), or the like. The rate of reduction in mass is expressed by the product of an etching rate (thickness that is removed per unit time) and a density. The thickness of the protective film 235 is, for example, approximately 0.2 μm.

In an exemplary aspect, the adjusting films 236 are formed by once forming a film over substantially the entire surface of the vibrating portion 120 and then forming the film into only predetermined regions by applying treatment, such as etching, for example. The adjusting films 236 each are made of a material of which the rate of reduction in mass resulting from etching is higher than that of the protective film 235. Specifically, the adjusting films 236 each are made of a metal, such as molybdenum (Mo), tungsten (W), gold (Au), platinum (Pt), and nickel (Ni).

As long as the relationship in the rate of reduction in mass between the protective film 235 and each adjusting film 236 is as described above, the magnitude relation in etching rate is freely selected.

As can be seen in FIG. 4, the thickness of each of the adjusting films 236A, 236D after the frequency adjusting step is greater than the thickness of each of the adjusting films 236B, 236C. Specifically, the thickness of each of the adjusting films 236A, 236D is 600 nm, and the thickness of each of the adjusting films 236B, 236C is 300 nm. As a result, the adjusting films 236B, 236C will have a greater mass than the adjusting films 236B, 236C.

(5. Function of Resonator)

The function of the resonator 10 will be described with reference to FIG. 4. In the present embodiment, the phase of electric field that is applied to the outer vibrating arms 135A, 135D and the phase of electric field that is applied to the inner vibrating arms 135B, 135C are set to opposite phases from each other. Thus, the outer vibrating arms 135A, 135D and the inner vibrating arms 135B, 135C are displaced in opposite direction from each other. For example, when the outer vibrating arms 135A, 135D displace their free ends toward the inner surface of the top lid 30, the inner vibrating arms 135B, 135C displace their free ends toward the inner surface of the bottom lid 20.

Thus, in the resonator 10 according to the present embodiment, during vibrations in opposite phases, the vibrating arm 135A and the vibrating arm 135B vibrate in opposite directions in the up-down direction around a first central axis extending parallel to the Y-axis between the vibrating arm 135A and the vibrating arm 135B shown in FIG. 3. The vibrating arm 135C and the vibrating arm 135D vibrate in opposite directions in the up-down direction around a second central axis extending parallel to the Y-axis between the vibrating arm 135C and the vibrating arm 135D. Thus, mutually opposite twisting moments are generated at the first and second central axes, so bending vibrations occur in the base portion 130.

(6. Function of Adjusting Films)

Next, the function of the adjusting films 236 will be described. In the resonant device 1 according to the present embodiment, after the above-described resonator 10 is formed, a trimming process of adjusting the film thicknesses of the adjusting films 236 is performed.

In the trimming step, first, the resonant frequency of each resonator 10 is measured, and a frequency distribution is calculated. Subsequently, the film thickness of each adjusting film 236 is adjusted based on the calculated frequency distribution. The film thicknesses of the adjusting films 236 can be adjusted by etching the adjusting films 236 through irradiation of, for example, argon (Ar) ion beam to the entire surface of the resonator 10. When the film thicknesses of the adjusting films 236 are adjusted, it is desirable that fly-off films be removed by cleaning the resonator 10.

In this way, the film thicknesses of the adjusting films 236 are adjusted in the trimming process, with the result that variations in frequency can be reduced among a plurality of the resonant devices 1 in the same wafer. By etching the adjusting films 236B, 236C more than the adjusting films 236A, 236D, the thickness of each of the adjusting films 236A, 236D can be made greater than the thickness of each of the adjusting films 236B, 236C.

(7. Experimental Results)

Figure 5:
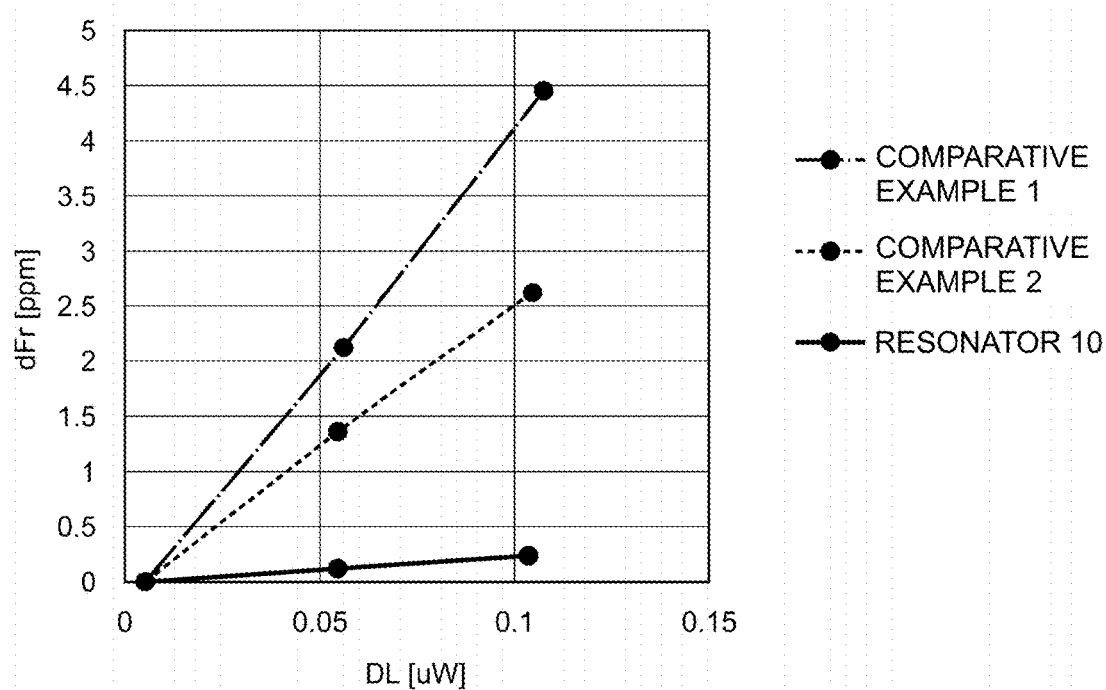
FIG. 5 is a graph that shows the relationship between the exemplary resonator and DLD.

The advantageous effect of the structure that each of the outer vibrating arms 135A, 135D is greater in mass than each of the inner vibrating arms 135B, 135C will be described with reference to FIG. 5. FIG. 5 is a graph that shows the influence of the relationship in thickness between each of the adjusting films 236A, 236D and each of the adjusting films 236B, 236C on DLD (drive level dependency). The abscissa axis represents drive level, and the ordinate axis represents the amount of shift in frequency.

In FIG. 5, the solid line represents the DLD of the resonator 10 according to the present embodiment. The graph represented by the alternate long and short dashed line is a graph that shows the DLD of a resonator of Comparative Example 1, and the graph represented by the dashed line is a graph that shows the DLD of a resonator of Comparative Example 2. The resonator 10 according to the present embodiment differs from the resonators of Comparative Examples 1 and 2 only in the thickness of each adjusting film 236, and the other configuration is the same. Specifically, in the resonator of Comparative Example 1, adjusting films formed in inner vibrating arms are thicker by 300 nm than adjusting films formed in outer vibrating arms. In the resonator of Comparative Example 2, the thickness of each of adjusting films formed in outer vibrating arms and the thickness of each of adjusting films formed in inner vibrating arms are the same.

As is clearly demonstrated by the graph of FIG. 5, the resonator 10 according to the present embodiment described herein has improved DLD as compared to the resonators of Comparative Examples 1 and 2.

In this way, in the resonator 10 according to the present embodiment, each of the outer vibrating arms 135A, 135D is greater in mass than each of the inner vibrating arms 135B, 135C. More preferably, each of the outer vibrating arms 135A, 135D is greater in mass than each of the inner vibrating arms 135B, 135C in the free end-side region (which is a region whose displacement caused by vibrations is relatively large and which corresponds to, for example, the weight portion G). More preferably, each of the adjusting films 236A, 236D respectively formed in the outer vibrating arms 135A, 135D is greater in thickness in the Z-axis direction (e.g., in the laminated direction) than each of the adjusting films 236B, 236C respectively formed in the inner vibrating arms 135B, 135C. Since the resonator 10 according to the present embodiment has such a configuration, the resonator 10 is able to improve DLD.

Second Exemplary Embodiment

From a second embodiment, the description of similar matters to those of the first embodiment is omitted, and only the differences will be described. Particularly, similar operation and advantageous effects with similar components will not be repeated one by one for each embodiment.

Figure 6:
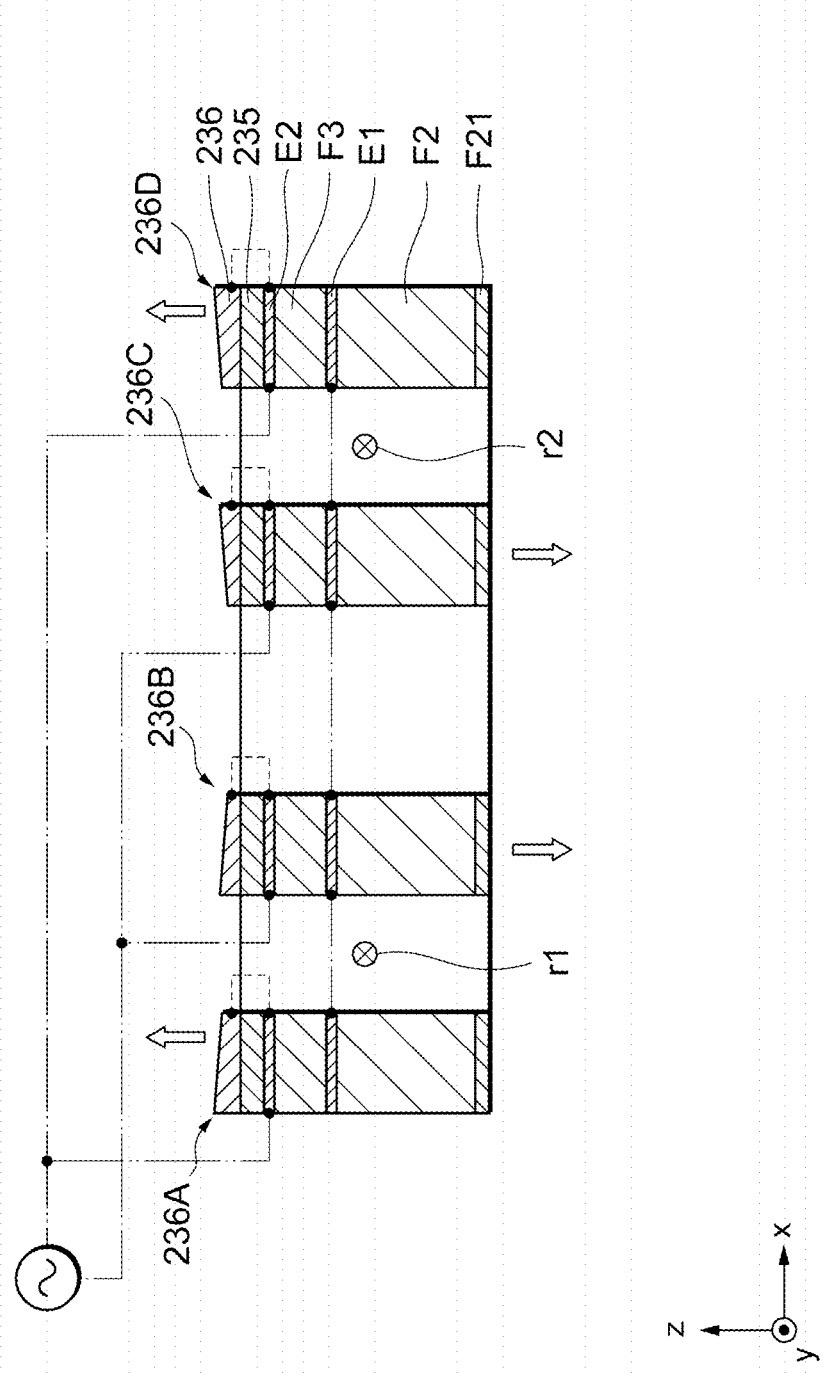
FIG. 6 is a cross-sectional view of a resonator according to a second exemplary embodiment of the present invention.

FIG. 6 is a cross-sectional view that schematically shows an example of the structure of a resonator 10A according to the present embodiment. The cross-sectional view of FIG. 6 is a cross-sectional view of the resonator 10A according to the second embodiment, taken along the line A-A' in FIG. 3.

In the resonator 10A according to the present embodiment, the adjusting films 236 each have a tapered shape such that an outer-side end portion is thicker than an inner-side end portion along the X-axis direction (i.e., direction in which the vibrating arms 135 are arranged). The shape of the adjusting film 236 is not limited to a tapered shape and may be a shape having uneven portions midway from the outer-side end portion toward the inner-side end portion. The other configuration of the resonator 10A is similar to that of the first embodiment.

Third Exemplary Embodiment

Figure 7:
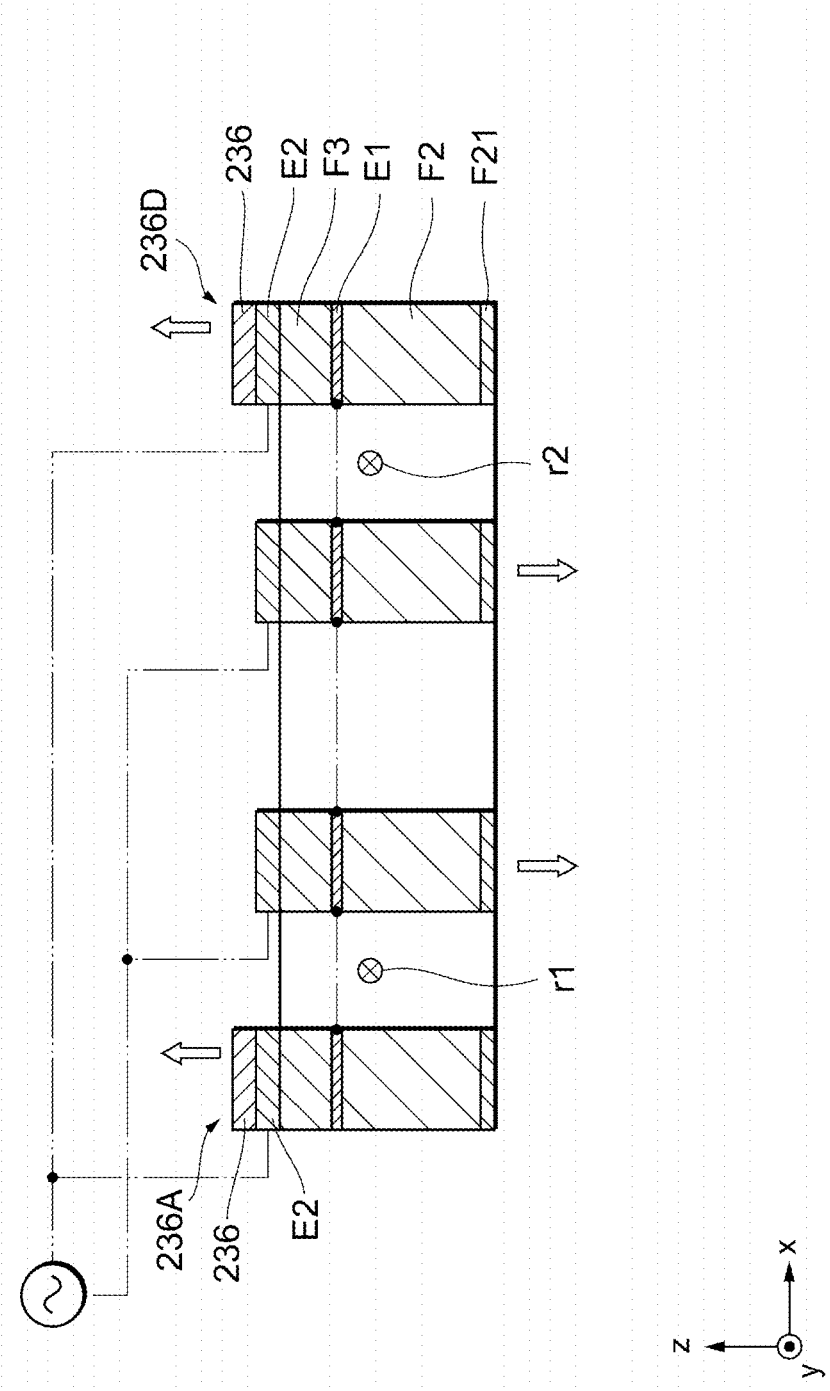
FIG. 7 is a cross-sectional view of a resonator according to a third exemplary embodiment of the present invention.

Hereinafter, of the components of a resonator 10B according to the present embodiment, differences from the first embodiment will be described. FIG. 7 is a cross-sectional view that schematically shows an example of the structure of the resonator 10B according to the present embodiment. The cross-sectional view of FIG. 7 is a cross-sectional view of the resonator 10B according to the third embodiment, taken along the line A-A' in FIG. 3.

As shown in FIG. 7, the resonator 10B according to the present embodiment has no protective film 235. With this configuration, a step of forming the protective film 235 can be omitted. In addition, in the resonator 10B according to the present embodiment, the adjusting film 236 is formed only in each of the outer vibrating arms to change the thickness between the inner and outer vibrating arms. However, the configuration is not limited thereto. In the resonator 10B, the adjusting film 236 may also be formed in each of the inner vibrating arms, and the thickness of each outer vibrating arm may be increased by intensively removing the adjusting film of each of the inner vibrating arms.

Additional Exemplary Embodiments

In the above-described embodiments, the configuration that the resonator 10 includes the four vibrating arms 135 is described. However, the configuration is not limited thereto. For example, the resonator 10 may have five or more vibrating arms 135. In this case, a plurality of inner vibrating arms 135 other than two vibrating arms 135 each located on the outermost side preferably vibrates in the same phase. At this time, the mass of each of the inner vibrating arms 135 other than the two vibrating arms 135 each located on the outermost side may be the same or may reduce toward the inner side (center side). In any case, the mass of each of the two vibrating arms 135 each located on the outermost side is greater than the mass of any one of the plurality of vibrating arms located between the two vibrating arms 135.

Exemplary embodiments of the present invention are described above. For example, a resonator 10 includes a base portion 130, and three or more vibrating arms 135 each including a first electrode E2, a second electrode E1, and a piezoelectric film F3 provided between the first electrode E2 and the second electrode E1 and having a top surface facing the first electrode E2. Moreover, the piezoelectric film F3 being configured to vibrate in a predetermined vibration mode when a voltage is applied between the first and second electrodes E2, E1, one end of each vibrating arm 135 being a fixed end that connects with a front end of the base portion 130, an other end of each vibrating arm 135 being a free end extending in a direction away from the front end. The three or more vibrating arms 135 include two first arms 135A (135D) each located on an outermost side in a direction in which the three or more vibrating arms 135 are arranged and configured to vibrate in a same phase, and one or more second arms 135B (135C) placed between the two first arms. Each first arm 135A (135D) is greater in mass than each second arm 135B (135C). With this configuration, in the resonator 10, DLD is improved.

Preferably, each of the first arms 135A, 135D is greater in mass at a distal end portion (weight portion G) than each of the second arms 135B, 135C. Preferably, each first arm 135A (135D) is greater in thickness at least at a distal end portion (weight portion G) than each second arm 135B (135C).

Preferably, the resonator 10 further includes a protective film 235 provided to face the top surface of the piezoelectric film F3 with the first electrode E2 interposed between the protective film 235 and the top surface and provided over a range from the vibrating arms 135 to the base portion 130, and an adjusting film 236 exposed at least at the distal end portion (e.g., weight portion G) in each of the three or more vibrating arms 135, and the adjusting film 236 formed in each first arm 135A (135D) is greater in thickness than the adjusting film formed in each second arm 135B (135C). In addition, preferably, an inner end portion of the adjusting film 236 is less in thickness than an outer end portion of the adjusting film 236 in the direction in which the three or more vibrating arms 135 are arranged.

Preferably, the adjusting films 236 each are made of a material whose rate of reduction in mass caused by etching is higher than that of the protective film 235. With this configuration, in the resonator 10 according to the present embodiment, the film thicknesses of the adjusting films 236 are adjusted in the trimming process, with the result that variations in frequency can be reduced among a plurality of the resonant devices 1 in the same wafer.

In addition, the protective film 235 may be an electrically insulating material, and the adjusting film 236 may be a metal, for example.

A resonant device 1 according to an embodiment includes the above-described resonator 10, a lid element 20, 30 covering the resonator 10, and an outer electrode.

In general, it is noted that the exemplary embodiments described above are intended to easily understand the present invention, and are not intended to limit interpretation of the present invention. The present invention can be modified or improved without departing from the purport of the invention, and the present invention also encompasses equivalents thereof. That is, each of the embodiments with design changes made by persons skilled in the art as needed is also included in the scope of the present invention as long as it includes the features of the present invention. For example, elements of each embodiment, the disposition, materials, conditions, shapes, sizes, and the like, of the elements are not limited to the illustrated ones, and may be changed as needed. The embodiments are illustrative, and, of course, elements of the different embodiments may be partially replaced or combined. The present invention also encompasses these modes as long as the features of the present invention are included.

REFERENCE SIGNS LIST 1 resonant device
10 resonator
30 top lid
20 bottom lid
140 holding portion
140a to 140d frame element
111, 112 holding arm
120 vibrating portion
130 base portion
135A to 135D vibrating arm
F2 Si substrate
F21 silicon oxide layer (temperature characteristics correction layer)
235 protective film
236 adjusting film

The invention claimed is:

1. A resonator comprising:
a base;
three or more vibrating arms that are each coupled to the base and extend in a same direction away from the base, with each vibrating arm including a first electrode, a second electrode, and a piezoelectric film disposed between the first and second electrodes and configured to vibrate in a predetermined vibration mode when a voltage is applied between the first and second electrodes; and
an adjusting film disposed to face the piezoelectric film with the first electrode interposed between the adjusting film and the piezoelectric film and exposed at least at a distal end in each of the three or more vibrating arms,
wherein the three or more vibrating arms include two first arms each positioned on an outermost side in a direction in which the three or more vibrating arms extend and are configured to vibrate in a same phase, and at least one second arm disposed between the two first arms,
wherein the adjusting film disposed in each of the two first arms comprises a greater thickness than the adjusting film disposed in the at least one second arm, and
wherein each of the two first arms has a greater mass at the distal end than at the at least one second arm at the distal end thereof.

2. The resonator according to claim 1, wherein the three or more vibrating arms each comprise a fixed end coupled to a first end of the base and a free end that extends in a direction away from the fixed end.

3. The resonator according to claim 1, wherein each of the two first arms is greater in thickness at least at a distal end than each of the at least one second arm.

4. The resonator according to claim 3, further comprising:
a protective film disposed to face the piezoelectric film with the first electrode interposed between the protective film and the piezoelectric film and provided over a range from the three or more vibrating arms to the base.

5. The resonator according to claim 4, wherein an inner end of the adjusting film is less than an outer end of the adjusting film in the direction in which the three or more vibrating arms are arranged.

6. The resonator according to claim 5, wherein the adjusting films disposed on each of the three or more vibrating arms have a tapered shaped.

7. The resonator according to claim 4, wherein the protective film is an electrically insulating material, and the adjusting film is a metal.

8. A resonant device comprising:
the resonator according to claim 1;
a lid element covering the resonator; and
an outer electrode.

9. A resonator comprising:
a base;
three or more vibrating arms that are each coupled to the base and extend in a same direction away from the base, with each vibrating arm including a first electrode, a second electrode, and a piezoelectric film disposed between the first and second electrodes and configured to vibrate when a voltage is applied between the first and second electrodes;
a protective film disposed to face the piezoelectric film with the first electrode interposed between the protective film and the piezoelectric film and provided over a range from the three or more vibrating arms to the base; and
an adjusting film exposed at least at a distal end in each of the three or more vibrating arms,
wherein the three or more vibrating arms include two first arms each positioned on an outermost side in a direction in which the three or more vibrating arms extend and are configured to vibrate in a same phase, and at least one second arm disposed between the two first arms, and
wherein each of the two first arms is greater in mass at the distal end than the at least one second arm, and
wherein the adjusting film disposed in each of the two first arms comprises a greater thickness than the adjusting film disposed in each of the at least one second arm.

10. The resonator according to claim 9, wherein an inner end of the adjusting film is less than an outer end of the adjusting film in the direction in which the three or more vibrating arms are arranged.

11. The resonator according to claim 9, wherein the adjusting film comprises a material having a rate of reduction in mass caused by etching that is higher than a rate of reduction in mass of the protective film caused by etching.

12. A resonator comprising:
a base;
a plurality of vibrating arms that are each coupled to the base and extend therefrom, with each vibrating arm including a first electrode, a second electrode, and a piezoelectric film disposed between the first and second electrodes and configured to vibrate in a predetermined vibration mode when a voltage is applied between the first and second electrodes and
an adjusting film disposed to face the piezoelectric film with the first electrode interposed between the adjusting film and the piezoelectric film and exposed at least at a distal end in each of the plurality of vibrating arms,
wherein the plurality of vibrating arms include a pair of outer vibrating arms that are positioned on outermost sides of the plurality of vibrating arms and that are configured to vibrate in a same phase, and at least one inner vibrating arm disposed between the pair of outer vibrating arms, wherein the adjusting film disposed in each of the pair of outer vibrating arms comprises a greater thickness than the adjusting film disposed in the at least one inner vibrating arm, and wherein a mass at a distal end of each of the outer vibrating arms is greater than a mass at a distal end of the at least one inner vibrating arm.

13. The resonator according to claim 12, wherein the plurality of vibrating arms each comprise a fixed end coupled to a first end of the base and a free end that extends in a direction away from the fixed end.

14. The resonator according to claim 12, wherein each of the pair of outer vibrating arms is greater in thickness at least at a distal end than the at least one inner vibrating arm.

15. The resonator according to claim 12, further comprising:

a protective film disposed to face the piezoelectric film with the first electrode interposed between the protective film and the piezoelectric film and provided over a range from the plurality of vibrating arms to the base; and an adjusting film exposed at least at the distal end in each of the plurality of vibrating arms, wherein the adjusting film disposed in each of the pair of outer vibrating arms comprises a greater thickness than the adjusting film disposed in the at least one inner vibrating arm.

\* \* \* \* \*